(12) United States Patent
Xiao et al.

(10) Patent No.: US 9,068,077 B2
(45) Date of Patent: Jun. 30, 2015

(54) LIGHT-CONVERSION FLEXIBLE POLYMER MATERIAL AND USE THEREOF

(75) Inventors: Zhiguo Xiao, Dalian (CN); Ying Chang, Dalian (CN); Yulong Sui, Dalian (CN); Yuening Wu, Dalian (CN); Maolong Li, Dalian (CN)

(73) Assignee: Dalian Luminglight Co., Ltd., Liaoling (CN)

( * ) Notice: Subject to any disclaimer, the term of this patent is extended or adjusted under 35 U.S.C. 154(b) by 561 days.

(21) Appl. No.: 13/496,548

(22) PCT Filed: Sep. 15, 2010

(86) PCT No.: PCT/CN2010/001413
§ 371 (c)(1),
(2), (4) Date: Apr. 4, 2012

(87) PCT Pub. No.: WO2011/032356
PCT Pub. Date: Mar. 24, 2011

(65) Prior Publication Data
US 2012/0181482 A1    Jul. 19, 2012

(30) Foreign Application Priority Data
Sep. 16, 2009    (CN) .......................... 2009 1 0187422

(51) Int. Cl.
| | |
|---|---|
| C08L 83/00 | (2006.01) |
| C08K 3/24 | (2006.01) |
| C08K 3/34 | (2006.01) |
| C08K 3/30 | (2006.01) |
| H01L 33/00 | (2010.01) |
| F21V 9/10 | (2006.01) |
| C08L 83/04 | (2006.01) |
| C09K 11/02 | (2006.01) |
| C08G 77/04 | (2006.01) |
| H01L 33/50 | (2010.01) |

(52) U.S. Cl.
CPC ................ C08L 83/04 (2013.01); C09K 11/02 (2013.01); *C08G 77/04* (2013.01); *H01L 33/501* (2013.01); *H01L 33/505* (2013.01); *C08K 3/24* (2013.01)

(58) Field of Classification Search
USPC .................................................. 252/301.36
See application file for complete search history.

(56) References Cited

U.S. PATENT DOCUMENTS

| | | | |
|---|---|---|---|
| 7,518,160 B2 | 4/2009 | Fukudome et al. | |
| 8,629,222 B2 * | 1/2014 | Takizawa et al. | ............. 525/478 |
| 2007/0031685 A1 | 2/2007 | Ko et al. | |
| 2008/0027200 A1 | 1/2008 | Imazawa et al. | |
| 2008/0280957 A1 | 11/2008 | Marlow et al. | |
| 2009/0212257 A1 | 8/2009 | Sohn et al. | |

FOREIGN PATENT DOCUMENTS

| | | |
|---|---|---|
| CN | 1431254 A | 7/2003 |
| CN | 1510766 A | 7/2004 |
| CN | 1858920 A | 11/2006 |
| CN | 1941431 A | 4/2007 |
| CN | 101012916 A | 8/2007 |
| CN | 101186818 A | 5/2008 |
| CN | 101338865 A | 1/2009 |
| CN | 101443192 A | 5/2009 |
| EP | 2336230 | 6/2011 |
| JP | 2007126536 A | 5/2007 |
| WO | 2007049187 A1 | 5/2007 |
| WO | 2007105853 A1 | 9/2007 |
| WO | 2008102628 | 8/2008 |
| WO | WO 2009/119841 | * 10/2009 |

OTHER PUBLICATIONS

EP Office Action dated Aug. 1, 2013, from EP Application No. 10816560.6.
English translation of JP Notice of Reasons for Rejection dated Jul. 2, 2013, from JP Application No. P2012-529092.
Korean Office Action (with English translation) dated Sep. 3, 2013, for KR Application No. 10-2012-7009143.
The Search Report issued in PCT/CN2010/001413 dated Dec. 30, 2010.
Mar. 19, 2015—(EP) Office Action—App 10816560.6.

* cited by examiner

*Primary Examiner* — Carol M Koslow
(74) *Attorney, Agent, or Firm* — Banner & Witcoff, Ltd.

(57) ABSTRACT

A light-conversion flexible polymer material consists of an organic silicone rubber (bi-component addition thermal vulcanizing liquid silicone rubber, 20.0-75.0%), a diluting agent (silicone oil, 10.0-20.0%), a luminescent material (one or more of aluminate, silicate, siliconitride and oxysulfide luminescent materials, 15.0-65.0%) and auxiliary. The polymer material can be bent randomly as required. The polymer material is made by mixing raw materials uniformly in a blending container, inpouring the obtained mixture into a mold and thermal-curing. The polymer material is used on the surface of a blue-light LED and the luminescent material in the light-conversion flexible polymer material can be excitated by light emitted from the blue light LED to give out light, which is combined with residual blue light into white light. The polymer material can be widely used in light-source devices such as lamp, nixie tube and backlight.

2 Claims, No Drawings

LIGHT-CONVERSION FLEXIBLE POLYMER MATERIAL AND USE THEREOF

CROSS-REFERENCE TO RELATED APPLICATIONS

The present application is a U.S. National Phase filing of International Application No. PCT/CN2010/001413 filed on Sep. 15, 2010, designating the United States of America and claiming priority to China Patent Application No. 200910187422.3 filed on Sep. 16, 2009. The present application claims priority to and the benefit of both the above-identified applications, and both the above-identified applications are incorporated by reference herein in their entireties.

TECHNICAL FIELD

Present invention relates to electronic display and lighting technical field, particularly to a polymer material blended with a fluorescent material, and the preparation and use thereof. More particularly, present invention relates to a light-conversion flexible polymer material useful for luminescent devices including LED backlight, digital display, and lighting, as well as the preparation and use thereof.

BACKGROUND ART

Nowadays, LED backlights, digital displays, and lighting devices are usually obtained by packaging fluorescence materials. There are many patents for such devices, e.g., Chinese patent 200510030192.1 ("White luminous component and preparation thereof"), Chinese patent 200310120736 ("Surface mounting type white LED"), Chinese patent 200710151099.5 ("Blue-purple or blue light excitation phosphor and preparation method thereof, and packaged white LED"). Such patents all relate to white luminous devices prepared by mixing fluorescent materials with a resin and applying the mixture on a LED chip. The white luminous devices prepared by such methods are difficult to ensure consistent lightness, color coordinate, color temperature and color rendering properties. Moreover, the fluorescent powder is disposed close to the chip, and is prone to be aged due to heat, and thus has reduced life time.

WO2007105853 discloses a method for preparing a photoluminescent film, wherein the used luminescent material is an inorganic luminescent material. This patent only describes that the photoluminescent film is prepared with silicon resin as film-forming material, but does not describe the relationship between the luminescent material in the photoluminescent film and color coordinate, color temperature and lightness; moreover, the method does not use cast molding, and cannot form various shapes. WO2007/049187 describes an encapsulant film containing a phosphor blended with silicone; this film material is installed on a blue LED to convert blue light into white light. However, this material is in film-shaped structure, thus it needs post-forming by lamination according to service conditions, thereby the process is complex. US2008/0280957 A1 discloses a method for producing LED using a plastic device with lens structure, the bottom of the plastic device with lens structure is a structure comprising fluorescent material layer, and is prepared by die casting or injection molding. Therefore, the structure and process are relatively complex, and the shape cannot be changed after molding. Chinese patent 200810067358.0 ("A LED illuminating apparatus with low attenuation and high light efficiency and its preparation method") and Chinese patent CN1858920A ("Packaging method for white LED lamp") relate to a method for manufacturing transparent case by adding a fluorescent material into a polymer material and molding. This method is suitable for packaging single LED. The shape of the molded material cannot be changed, and thus its installation and application are restricted. Chinese patent CN101012916A ("A lamp using LED as light source") discloses a method for fixing light converting material on the case of a lamp. Although this method avoids the problem of fluorescent material aging at high temperature, the material has a certain distance from the light source, leading to reduced luminescent efficiency of the fluorescent material. This method is only suitable for preparing products such as lamps or the like, and therefore has restricted application.

SUMMARY OF THE INVENTION

To overcome above mentioned drawbacks, present invention uses an organosilicon rubber as molding material, and a diluting agent, a fluorescent material and an auxiliary are added and mixed homogenously; then the mixture is molded by casting and thermal curing. Various shapes of moulds can be designed according to practical uses. The mould can also be designed as a structure with a lens form to be used for the cast molding, in terms of the optical characteristics of blue LED light source. The molded polymer material is flexible and elastic, and has a certain strength. The molded polymer material can be bended and deformed randomly, and can be assembled in a device as desired.

The present invention provides a light-conversion flexible polymer material, consisting of, by mass,

| organosilicon rubber | 20.0% to 75.0% |
| --- | --- |
| diluting agent | 10.0% to 20.0% |
| fluorescent material | 15.0% to 65.0% |
| auxiliary | 0.0% to 5.0% | wherein, the organosilicon rubber is a bi-component addition thermal vulcanizing liquid silicone rubber; the diluting agent is selected from the group consisting of methyl silicone oil, dimethyl silicone oil, ethyl silicone oil, phenyl silicone oil, methylethoxy silicone oil or methylvinyl silicone oil; the auxiliary is selected from the group consisting of leveling agent, defoaming agent, coupling agent or wetting-dispersing agent or combinations thereof.

The fluorescent material is one or two of aluminate fluorescent material, silicate fluorescent material, siliconitride fluorescent material and oxysulfide fluorescent material. The fluorescent material can be excited by a blue LED with an emitting spectrum from 440 to 475 nm, which acts as an excitation light source, to give out an emitting spectrum having at least one peak wavelength between 525 and 650 nm. The light emitted by the fluorescent material and the light emitted by the blue LED can be combined into white light or other colors of light.

In the light-conversion flexible polymer material according to present invention, the particle size of the fluorescent material is preferably 3 to 15 μm.

The light-conversion flexible polymer material according to present invention has various applications, and can be used in light-source devices such as lamps, nixie tubes, backlights or the like.

The problems existing in prior art can be effectively avoided by using the light-conversion flexible polymer materials according present invention. This material is flexible and has certain strength and toughness; and the material can be casting molded in various shapes of moulds designed for practical uses. The fluorescent material is uniformly dispersed in the molded light-conversion flexible polymer material. A luminous device prepared by this material has homogenous light color. Moreover, the material is not closely attached to the chip structure during use, thus the aging problem caused by heat can be avoided, and the service life of the products can be effectively improved.

DETAIL DESCRIPTION OF EMBODIMENTS

The light-conversion flexible polymer material according to present invention consists of organosilicon rubber, diluting agent, fluorescent material, and auxiliary. The components and their percentage contents by mass are as follows:

| | |
|---|---|
| organosilicon rubber | 20.0%-75.0% |
| diluting agent | 10.0%-20.0% |
| fluorescent material | 15.0%-65.0% |
| auxiliary | 0.0%-5.0% | wherein, the fluorescent material is excited by a blue LED with an emitting spectrum from 440 to 475 nm, which acts as an excitation light source, to give out an emitting spectrum having at least one peak wavelength between 525 and 650 nm.

The light emitted by the fluorescent material and the light emitted by the blue LED can be combined into white or other colors of light. The fluorescent material is selected from the group consisting of aluminate fluorescent material, silicate fluorescent material, siliconitride fluorescent material and oxysulfide fluorescent material, and combination thereof.

The main chemical composition of the aluminate fluorescent material is expressed as:

$$aR_2O_3 \cdot R'_2O_3 : xCe, yLi, zF;$$

wherein R is one or more of Y, Tb, and Gd; R' is one or two of Al and Ga; a, x, y, z are molar coefficients, and $0.45 \leq a \leq 0.65$, $0.0 \leq x \leq 0.04$, $0.0 \leq y \leq 0.04$, $0.0 \leq z \leq 0.2$. The wavelength of main emitting peak of the material varies between 525 and 560 nm as a function of the composition.

The main chemical composition of the silicate fluorescent material is expressed as:

$$bMO \cdot SiO_2 : xEu, yLi, zF;$$

wherein M is one or more of Sr, Ca, Ba, and Mg; b, x, y, z are molar coefficients, and $1.4 \leq b \leq 3.1$, $0.015 \leq x \leq 0.1$, $0.0 \leq y \leq 0.05$, $0.0 \leq z \leq 0.25$. The wavelength of main emitting peak of the material varies between 525 and 580 nm as a function of the composition.

The main chemical composition of the siliconitride fluorescent material is expressed as:

$$(Sr_eCa_{1-e})_{2-x}Si_5N_8 : Eux, Liy, Fz;$$

wherein e, x, y, z are molar coefficients, and $0.1 \leq e \leq 1$, $0.01 \leq x \leq 0.1$, $0.0 \leq y \leq 0.1$, $0.0 \leq z \leq 0.5$. The wavelength of main emitting peak of the material varies between 580 and 650 nm as a function of the composition.

The main chemical composition of the oxysulfide fluorescent material is expressed as:

$$Y_{2-x}O_2S : Eux, Mgy, Tiz, Li\beta, F\gamma;$$

Wherein x, y, z, β, γ are molar coefficients, and $0.01 \leq x \leq 0.1$, $0.005 \leq y \leq 0.02$, $0.05 \leq z \leq 0.25$, $0.0 \leq \beta \leq 0.1$, $0.0 \leq \gamma \leq 0.5$. The wavelength of main emitting peak of the material varies between 610 and 630 nm as a function of the composition.

Particle size of the fluorescent material is preferably 3 to 15 micrometer. The resultant fluorescent material products are homogeneously dispersed and have good luminous effect.

The fluorescent materials can be excited by light emitted from a ultraviolet or blue LED to give out light, which can be combined with remaining ultraviolet or blue light into white light or other colors of light. The fluorescent materials have different features in body color and luminescent color, and therefore can be selected on the basis of different situations during the preparation of a flexible polymer material of the luminescent materials. The silicate and aluminate luminescent materials are selected as orange and yellow luminescent materials; siliconitride and oxysulfide luminescent materials are selected as red luminescent materials. A yellow luminescent material, an orange luminescent material and a red luminescent material can be used in combination. Color coordinate, color temperature and color rendering index can be adjusted through the combination use, so as to be suitable for various uses. A luminescent material emitting yellow light used in combination with a luminescent material emitting red light can improve color rendering index and obtain white light with high color rendering index, and thus is useful in luminous devices which need high color rendering index. The light-conversion flexible polymer material can be combined with a LED to emit a while light or other colors of light, and therefore can be used in light-source devices such as lamps, nixie tubes and backlights.

The organosilicon rubber used is a bi-component addition thermal vulcanizing liquid silicone rubber with good transparency, flexibility and good plasticity. This resin has good thermal oxidation stability, excellent electrical insulation, moistureproof, waterproof, antirust, cold resistance, antiozone and weather resistances. The resin can work at high temperature for a long time without yellowing; and cured material still has flexibility, plasticity and certain strength, and can be bended and deformed randomly, thereby is suitable for devices with irregular shape.

The diluting agent may be one of methyl silicone oil, dimethyl silicone oil, ethyl silicone oil, phenyl silicone oil, methylethoxy silicone oil or methylvinyl silicone oil.

The auxiliary may be one or more selected from the group consisting of leveling agent, defoaming agent, coupling agent and wetting-dispersing agent.

The organosilicon resin, diluting agent, fluorescent material and auxiliary are mixed thoroughly, and then the mixture is molded by casting and thermal curing. The material can be used in light-source devices such as lamps, nixie tubes, backlights and so on. The material can be casting molded according to the desired shape of a device and then directly fixed on a blue light source. The molded material can also be bended and deformed according to the shape of the device.

Casting is a method for processing organic polymer materials. Early cast molding comprises inpouring a liquid monomer or polymer into a mould under standard atmosphere, and curing by polymerization to be molded into an article having the same shape as the mould cavity. As the development of molding technique, traditional casting concept has been changed; a polymer solution, dispersion and melt can also be used for cast molding.

Since the fluorescent material is an inorganic material, this material is prone to darken during friction with metal materials, thereby loses luminescent properties. Therefore, the fluorescent material should be kept away from contacting with a metal material during preparation and processing. Casting technique can effectively avoid the drawback of traditional polymer material, i.e. darkening and losing luminescent properties due to the extrusion and friction during the fabrication and processing.

According to the present invention, organosilicon rubber, diluting agent, fluorescent material and auxiliary are mixed homogeneously, and the mixture is inpoured into a mould, the mixture is molded by casting and thermal curing into an article having the same shape as the mould cavity. Improvement can be obtained by casting process over the traditional LED packaging process; in particular, substantially reduced process steps, increased production efficiency, production automation being achievable, and improved operation environment. It is more important that the fluorescent material is dispersed in the polymer resin homogeneously. The luminescent device made from the fluorescent material has improved luminescent consistency and good light-conversion effect; moreover, various products can be produced therefrom.

Using such light-conversion flexible polymer material can break way from the manner of fabricating LED by traditional packaging method. The light-conversion flexible polymer material can be adhered to a chip or directly assembled on a chip, and the resultant luminescent effect is very close to a LED fabricated by means of packaging. At the meantime, the light-conversion flexible polymer material can also be casting molded into a suitable shape designed for practical uses, such as a shape with lens structure, thereby effectively improving the light conversion efficiency, achieving a secondary light distribution design, increasing light extraction efficiency, and optimizing optical distribution. The luminescent devices fabricated by this method are very convenient for installation, maintenance, and replacement; thus, the construction process is simplified and various products can be produced. Since the material according to present invention has good flexibility and strength, the material can be bended and folded randomly, and therefore is particularly suitable for preparing special luminescent devices with irregular shapes. Another advantage of the invention is that the material can be molded through cast molding. Since fluorescent material is an inorganic material, this material is prone to darken during friction with metal materials and thereby losing luminescent properties. When a fluorescent material is molded by injection molding, it darkens due to friction and extrusion, and therefore the luminescent properties are degraded. This phenomenon can be effectively avoided by cast molding method.

The light-conversion flexible polymer material according to present invention will be illustrated by following specific examples.

Example 1

Formulation for Cast Molding

| | | |
|---|---|---|
| organosilicon rubber | | 50.0% |
| diluting agent: methyl silicone oil | | 20.0% |
| auxiliary: | wetting agent | 0.5% |
| | coupling agent | 1.0% |
| | defoaming agent | 0.2% |
| fluorescent material (aluminate, yellow) $0.56Y_2O_3 \cdot Al_2O_3 \cdot 0.1Gd_2O_3 : 0.04Ce, 0.02F$ | | 23.8% |

Wherein the organosilicon rubber is a bi-component addition thermal vulcanizing liquid silicone rubber.

Process: the liquid feedstocks in the formulation were added into a blending container, and mixed homogeneously. The fluorescent material was added into the container while stirring. The mixture was mixed thoroughly and subjected to vacuum defoaming treatment. The liquid feedstock mixture was added into a mould, and placed in an oven at 145° C. for 2 minutes for curing. After curing, the molded light-conversion flexible polymer material was taken out from the mould.

The prepared light-conversion flexible polymer material can be used on the surface of a blue LED. The fluorescent material in the light-conversion flexible polymer material can be excited by the light emitting from the blue LED to give out light, which was combined with remaining blue light into white light.

Example 2

Formulation for Cast Molding

| | | |
|---|---|---|
| organosilicon rubber | | 20.0% |
| diluting agent: dimethyl silicone oil | | 10.0% |
| auxiliary: | wetting agent | 2.0% |
| | coupling agent | 2.0% |
| | defoaming agent | 1.0% |
| silicate green fluorescent material $0.9SrO \cdot 1.1BaO \cdot 0.1MgO \cdot SiO_2 : 0.2Eu, 0.001Li, 0.05F$; | | 26.0% |
| oxysulfide red fluorescent material $YO_2S:0.3Eu, 0.02Mg, 0.15Ti$; | | 39.0% |

Wherein the organosilicon rubber is a bi-component addition thermal vulcanizing liquid silicone rubber.

Process: the liquid feedstocks in the formulation were added into a blending container, and mixed homogeneously. The fluorescent materials were added into the container while stirring. The mixture was mixed thoroughly and subjected to vacuum defoaming treatment. The liquid feedstock mixture was added into a mould, and placed in a oven at 140° C. for 3 minutes for curing. After curing, the molded light-conversion flexible polymer material was taken out from the mould.

The prepared light-conversion flexible polymer material can be directly placed on or adhered to the surface of a blue LED. The fluorescent material in the light-conversion flexible polymer material can be excited by the light emitting from the blue LED to give out light, which was combined with remaining blue light into white light.

Example 3

Formulation for Cast Molding

| | |
|---|---|
| organosilicon rubber | 75.0% |
| diluting agent: ethyl silicone oil | 9.0% |
| auxiliary: defoaming agent | 1.0% |
| fluorescent material (silicate, yellow) $0.1CaO \cdot 1.5SrO \cdot 0.4BaO \cdot 0.1MgO \cdot SiO_2 : 0.1Eu, 0.2Li, 0.05F$ | 15.0% |

Wherein the organosilicon rubber is a bi-component addition thermal vulcanizing liquid silicone rubber.

Process: the liquid feedstocks in the formulation were added into a blending container, and mixed homogeneously. The fluorescent material was added into the container while stirring. The mixture was mixed thoroughly and subjected to vacuum defoaming treatment. The liquid feedstock mixture was added into a mould from the bottom, and the charging was stopped when the feedstock overflowed from the upper mouth, then the mouths at both ends were sealed. The mould was placed in an oven at 143° C. for 3 minutes for curing.

After curing, the molded light-conversion flexible polymer material was taken out from the mould.

The prepared light-conversion flexible polymer material can be directly placed on or adhered to the surface of a blue LED. The fluorescent material in the light-conversion flexible polymer material can be excited by the light emitting from the blue LED to give out light, which was combined with remaining blue light into white light.

Example 4

Formulation for Cast Molding

| | |
|---|---|
| organosilicon rubber | 34.0% |
| diluting agent: phenyl silicone oil | 10.0% |
| auxiliary: leveling agent | 1.0% |
| fluorescent material (yellow) $0.58Y_2O_3 \cdot Al_2O_3 \cdot 0.1Ga_2O_3$: 0.008Ce, 0.004Li, 0.02F | 53.0% |
| fluorescent material (red) $(Sr_{0.5}Ca_{0.5})_{2-y}Si_5N_8$: 0.05Eu, 0.003Li, 0.001F | 2.0% | wherein the organosilicon rubber is a bi-component addition thermal vulcanizing liquid silicone rubber.

Process: the liquid feedstocks in the formulation were added into a blending container, and mixed homogeneously. The fluorescent material was added into the container while stirring. The mixture was mixed thoroughly and subjected to vacuum defoaming treatment. The liquid feedstock mixture was added into a mould from the bottom, and the charging was stopped when the feedstock overflowed from the upper mouth, then the mouths at both ends were sealed. The mould was placed in an oven at 145° C. for 2 minutes for curing. After curing, the molded light-conversion flexible polymer material was taken out from the mould.

The prepared light-conversion flexible polymer material can be directly placed on or adhered to the surface of a blue LED. The fluorescent material in the light-conversion flexible polymer material can be excited by the light emitting from the blue LED to give out light, which was combined with remaining blue light into warm white light.

Example 5

Formulation for Cast Molding

| | |
|---|---|
| organosilicon rubber | 40.0% |
| diluting agent: methylvinyl silicone oil | 10.0% |
| fluorescent material (silicate, orange) $1.4SrO \cdot 0.2BaO \cdot SiO_2$:0.05Eu, 0.005Li | 50.0% |

Wherein the organosilicon rubber is a bi-component addition thermal vulcanizing liquid silicone rubber.

Process: the liquid feedstocks in the formulation were added into a blending container, and mixed homogeneously. The fluorescent materials were added into the container while stirring. The mixture was mixed thoroughly and subjected to vacuum defoaming treatment. The liquid feedstock mixture was added into a mould, and placed in an oven at 145° C. for 2 minutes for curing. After curing, the molded light-conversion flexible polymer material was taken out from the mould.

The prepared light-conversion flexible polymer material can be directly placed on or adhered to the surface of a blue LED. The fluorescent material in the light-conversion flexible polymer material can be excited by the light emitting from the blue LED to give out orange red light.

Example 6

Formulation for Cast Molding

| | |
|---|---|
| organosilicon rubber | 67.0% |
| diluting agent: methylethoxy silicone oil | 10.0% |
| auxiliary: defoaming agent | 1.0% |
| wetting-dispersing agent | 2.0% |
| fluorescent material (silicate, green) $0.9SrO \cdot 1.1BaO \cdot SiO_2$:0.03Eu, 0.005Li | 20.0% |

Wherein the organosilicon rubber is a bi-component addition thermal vulcanizing liquid silicone rubber.

Process: the liquid feedstocks in the formulation were added into a blending container, and mixed homogeneously. The fluorescent material was added into the container while stirring. The mixture was mixed thoroughly and subjected to vacuum defoaming treatment. The liquid feedstock mixture was added into a mould from the bottom, and the charging was stopped when the feedstock overflowed from the upper mouth, then the mouths at both ends were sealed. The mould was placed in an oven at 140° C. for 3 minutes for curing. After curing, the molded light-conversion flexible polymer material was taken out from the mould.

The prepared light-conversion flexible polymer material can be directly placed on or adhered to the surface of a blue LED. The fluorescent material in the light-conversion flexible polymer material can be excited by the light emitting from the blue LED to give out green light.

Example 7

Formulation for Cast Molding

| | |
|---|---|
| organosilicon rubber | 53.0% |
| diluting agent: methylethoxy silicone oil | 10.0% |
| auxiliary: leveling agent | 2.0% |
| fluorescent material (aluminate, yellow) $0.58Y_2O_3 \cdot Al_2O_3 \cdot 0.1Ga_2O_3$: 0.008Ce, 0.004Li, 0.02F | 15.0% |
| fluorescent material (silicate, orange red) $1.4SrO \cdot 0.2BaO \cdot SiO_2$:0.05Eu, 0.005Li | 20.0% |

Wherein the organosilicon rubber is a bi-component addition thermal vulcanizing liquid silicone rubber.

Process: the liquid feedstocks in the formulation were added into a blending container, and mixed homogeneously. The fluorescent material was added into the container while stirring. The mixture was mixed thoroughly and subjected to vacuum defoaming treatment. The liquid feedstock mixture was added into a mould from the bottom, and the charging was stopped when the feedstock overflowed from the upper mouth, then the mouths at both ends were sealed. The mould was placed in an oven at 140° C. for 3 minutes for curing. After curing, the molded light-conversion flexible polymer material was taken out from the mould.

The prepared light-conversion flexible polymer material can be directly placed on or adhered to the surface of a blue LED. The fluorescent material in the light-conversion flexible polymer material can be excited by the light emitting from the blue LED to give out warm white light.

The invention claimed is:
1. A light-conversion flexible polymer material, characterized in that the material consists of, by mass:

| | |
|---|---|
| organosilicon rubber | 20.0%-75.0% |
| diluting agent | 10.0%-20.0% |
| fluorescent material | 15.0%-65.0% |
| auxiliary | 0.0%-5.0% | wherein, the organosilicon rubber is a bi-component addition thermal vulcanizing liquid silicone rubber;
the diluting agent is methyl silicone oil, dimethyl silicone oil, ethyl silicone oil, phenyl silicone oil, methylethoxy silicone oil, or methylvinyl silicone oil;
the auxiliary is selected from the group consisting of leveling agent, defoaming agent, coupling agent, or wetting-dispersing agent, or combination thereof;
the fluorescent material is one or two of aluminate fluorescent material, silicate fluorescent material, siliconitride fluorescent material, and oxysulfide fluorescent material; the fluorescent materials are excited by a blue LED with an emitting spectrum from 440 to 475 nm, which acts as an excitation light source, to give out an emitting spectrum having at least one peak wavelength between 525 and 650 nm; the light emitted by the fluorescent material and the light emitted by the blue LED is combined into white light or other colors of light.

2. The light-conversion flexible polymer material according to claim 1, characterized in that the particle size of the fluorescent material is 3 to 15 μm.

* * * * *